(12) United States Patent
Aoki et al.

(10) Patent No.: US 9,473,869 B2
(45) Date of Patent: Oct. 18, 2016

(54) AUDIO SIGNAL PROCESSING DEVICE

(71) Applicant: Yamaha Corporation, Hamamatsu-shi, Shizuoka (JP)

(72) Inventors: Ryotaro Aoki, Hamamatsu (JP); Hideyuki Tokuhisa, Iwata (JP)

(73) Assignee: Yamaha Corporation, Hamamatsu-shi (JP)

( * ) Notice: Subject to any disclaimer, the term of this patent is extended or adjusted under 35 U.S.C. 154(b) by 86 days.

(21) Appl. No.: 14/459,441

(22) Filed: Aug. 14, 2014

(65) Prior Publication Data

US 2015/0049881 A1    Feb. 19, 2015

(30) Foreign Application Priority Data

Aug. 19, 2013 (JP) ................................. 2013-169487

(51) Int. Cl.
| | | |
|---|---|---|
| *H03G 5/00* | (2006.01) | |
| *H04S 3/00* | (2006.01) | |
| *G10L 19/008* | (2013.01) | |
| *G10L 21/038* | (2013.01) | |
| *H03G 7/00* | (2006.01) | |
| *H04R 1/40* | (2006.01) | |
| *H04R 3/12* | (2006.01) | |

(52) U.S. Cl.
CPC .............. *H04S 3/002* (2013.01); *G10L 19/008* (2013.01); *G10L 21/038* (2013.01); *H03G 7/002* (2013.01); *G10H 2250/601* (2013.01); *G10H 2250/605* (2013.01); *H04R 1/403* (2013.01); *H04R 3/12* (2013.01); *H04S 2400/07* (2013.01); *H04S 2400/15* (2013.01)

(58) Field of Classification Search
CPC ...... H03G 5/165; H03G 5/025; H03G 5/005; H04R 3/04
See application file for complete search history.

(56) References Cited

U.S. PATENT DOCUMENTS

| | | | | |
|---|---|---|---|---|
| 4,125,789 A | * | 11/1978 | Van Schoiack | G01D 3/06 327/541 |
| 4,700,390 A | | 10/1987 | Machida | |
| 5,668,885 A | * | 9/1997 | Oda | H04R 3/04 381/98 |
| 5,828,755 A | * | 10/1998 | Feremans | H04R 5/04 381/61 |
| 5,835,042 A | * | 11/1998 | Ichimura | H04L 27/18 341/143 |
| 6,134,330 A | * | 10/2000 | De Poortere | H04R 3/04 381/61 |
| 6,169,800 B1 | * | 1/2001 | Hanna | H03F 1/0222 379/252 |
| 6,456,718 B1 | * | 9/2002 | Aarts | H03G 9/025 381/61 |
| 2009/0147963 A1 | | 6/2009 | Smith | |
| 2010/0054320 A1 | * | 3/2010 | Glissmann | H04B 1/62 375/230 |

FOREIGN PATENT DOCUMENTS

JP    2011-87192 A    4/2011

OTHER PUBLICATIONS

Extended European Search Report dated Feb. 12, 2015 (six (6) pages).

* cited by examiner

*Primary Examiner* — Simon Sing
(74) *Attorney, Agent, or Firm* — Crowell & Moring LLP

(57) ABSTRACT

An audio signal processing device includes: an input section to which an audio signal is input; a bias processing section configured to add a bias signal to the audio signal; a calculation section configured to perform a power calculation on the audio signal to which the bias signal has been added by the bias processing section; and an adding unit configured to add the audio signal on which the power calculation is performed by the calculation section to the audio signal having been input to the input section.

7 Claims, 7 Drawing Sheets

AUDIO SIGNAL PROCESSING DEVICE

BACKGROUND

The present invention relates to an audio signal processing device for performing various kinds of processing on an audio signal, and more particularly, to a technique for expanding the low-frequency components of the signal.

It is physically impossible for speakers with a small diameter to output the low-frequency components of an audio signal in some cases. A sub-woofer is generally used to complement the low-frequency components. However, such a sub-woofer is generally a monaural speaker and cannot properly output source sound of a plurality of channels. For example, even in the case that a drum is placed at the left channel and a bass is placed at the right channel, the sounds thereof are eventually output from a single sub-woofer.

Hence, a method has been proposed in which it is perceived as if low-frequency components, not output physically, are output by utilizing a phenomenon referred to as "missing fundamental" produced by generating the harmonics of the low-frequency components of an audio signal and by adding the harmonics to the original audio signal.

For example, the device disclosed in JP-A-2011-87192 performs power calculations (for example, third and fourth power calculations) of an audio signal and generates odd-numbered and even-numbered order harmonics.

In the case that a power calculation (for example, a second power calculation) is performed for an original signal having negative components as shown in FIG. 10A, the negative components are converted into positive components (full-wave rectified) as shown in FIG. 10B, whereby the waveform of the original signal cannot be maintained. In particular, as indicated by broken lines in FIG. 10B, at positions in which the amplitude value of the signal is zero, the waveform becomes non-linear after the second power calculation although the original signal had a linearly zero-crossing waveform, thereby causing unwanted distortion components. As a result, for example, in a steadily generated bass sound having little distortion (for example, the bass of a stringed instrument), a distortion due to this kind of change in the waveform becomes conspicuous.

SUMMARY

The presently invention may provide an audio signal processing device capable of generating harmonics while suppressing the change in the waveform of an original signal.

The audio signal processing device may comprise: an input section to which an audio signal is input; a bias processing section configured to add a bias signal to the audio signal; a calculation section configured to perform a power calculation on the audio signal to which the bias signal has been added by the bias processing section; and an adding unit configured to add the audio signal on which the power calculation is performed by the calculation section to the audio signal having been input to the input section.

The audio signal may include audio signals of a plurality of channels, and the audio signals of the plurality of channels may be processed individually.

The audio signal processing device may further comprise: a DRC section configured to compress a dynamic range of the audio signal on which the power calculation is performed by the calculation section.

The bias processing section may add the bias signal corresponding to an amplitude value of the audio signal.

The audio signal processing device may further comprise: a smoothing processing section configured to perform smoothing processing on the amplitude value of the audio signal, and the bias processing section may add the bias signal corresponding to the amplitude value on which the smoothing processing is performed by the smoothing processing section.

The smoothing processing may include peak hold processing.

There may be provided an audio signal processing method comprising: inputting an audio signal; adding a bias signal to the audio signal; performing a power calculation on the audio signal to which the bias signal has been added; and adding the audio signal on which the power calculation is performed to the audio signal having been input.

DETAILED DESCRIPTION OF EXEMPLARY EMBODIMENTS

Figure 1:
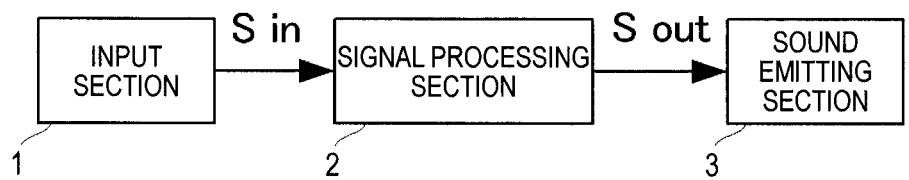
FIG. 1 is a block diagram showing the configuration of a speaker apparatus.

An audio signal processing device according to an embodiment of the present invention will be described below. FIG. 1 is a block diagram showing the configuration of a speaker apparatus incorporating the audio signal processing device according to the present invention. The speaker apparatus is equipped with an input section 1, a signal processing section 2 and a sound emitting section 3.

To the input section 1, an audio signal of a plurality of channels (C: center channel, L: front left, R: front right, SL: surround left, SR: surround right, SBL: surround back left, SBR: surround back right, LFE: sub-woofer) is input. The number of the channels is not limited to the 7.1 channels shown in FIG. 2A, but an example in which an audio signal of more channels is input may be used, or a monaural signal may be input.

The signal processing section 2 performs low-frequency band expansion processing for an audio signal Sin input from the input section 1 and outputs an audio signal Sout to the sound emitting section 3. The sound emitting section 3 performs sound field imparting processing for the audio signal Sout input from the signal processing section 2, amplifies the processed signal and emits sound from speakers (not shown). The speakers may be provided independently for the respective channels or may be provided as a speaker array in which numerous small-diameter speaker units are arranged. In the case of such a speaker array, it may be possible that the audio signals of the respective channels are distributed to all (or some) of the speaker units and subjected to delay control, whereby the emitted sound is beamed directly to the listener or reflected by wall surfaces and transmitted to the listener.

Figure 2A:
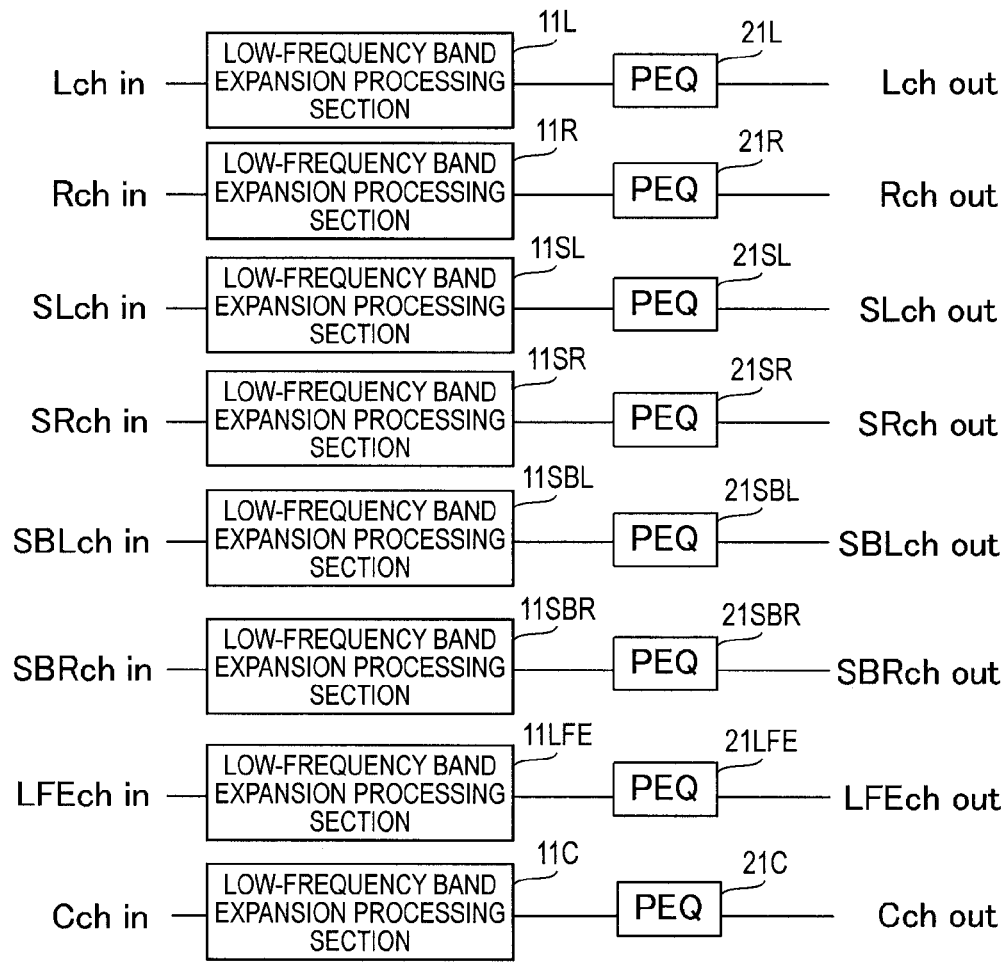
FIGS. 2A and 2B are block diagrams showing the configuration of a signal processing section.
Figure 2B:
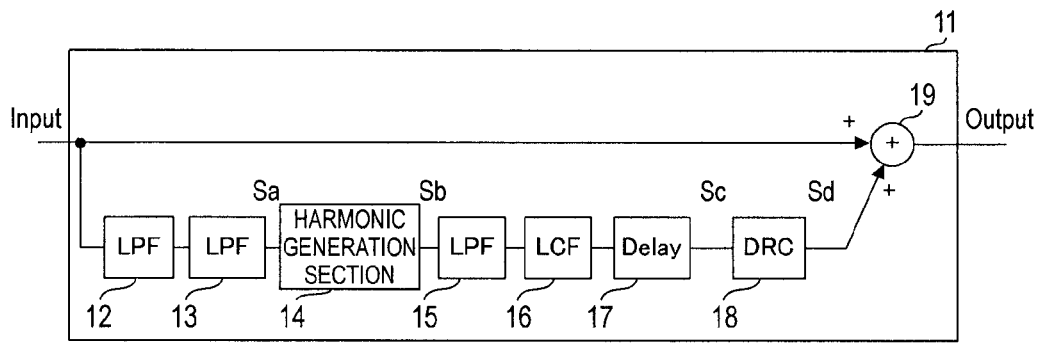

FIGS. 2A and 2B are block diagrams showing the configuration of the signal processing section 2. A symbol such as "Lch in" shown on the left side of FIG. 2A indicates the input of the audio signal of each channel and indicates the audio signal (Sin) input from the input section 1. A symbol such as "Lch out" shown on the right side of FIG. 2A indicates the output of the audio signal of each channel and indicates the audio signal (Sout) output to the sound emitting section 3.

As shown in FIG. 2A, the signal processing section 2 is equipped with low-frequency band expansion processing sections 11 (low-frequency band expansion processing section 11L, low-frequency band expansion processing section 11R, low-frequency band expansion processing section 11SL, low-frequency band expansion processing section 11SR, low-frequency band expansion processing section 11SBL, low-frequency band expansion processing section 11SBR, low-frequency band expansion processing section 11LFE and low-frequency band expansion processing section 11C) and PEQs 21 (PEQ 21L, PEQ 21R, PEQ 21SL, PEQ 21SR, PEQ 21SBL, PEQ 21SBR, PEQ 21LFE and PEQ 21C) for the respective channels. In other words, in this embodiment, the audio signals of the respective channels are processed individually in the signal processing section 2. Processes to be performed for the audio signals may be different for the respective channels. Furthermore, some processes may not be performed for the audio signals.

The low-frequency band expansion processing section 11 provided for each channel is equipped with an LPF 12, an LPF 13, a harmonic generation section 14, an LPF 15, an LCF 16, a Delay 17, a DRC 18 and an addition section 19 as shown in FIG. 2B.

Although a speaker apparatus equipped with the signal processing section 2 will be described in this embodiment, the audio signal processing device according to the present invention can also be realized by using software (stored in media) that is executed by other various devices, such as an audio amplifier, a personal computer and a mobile terminal (for example, a smart phone).

The low-frequency band expansion processing section 11 obtains the audio signal of each channel and outputs the signal to the LPF 12. In the following description, although processing for the audio signal of one of the respective channels is represented as an example, the audio signals of the respective channels are processed individually in actual practice.

The LPF 12, serving as a low-pass filter, attenuates frequency band components having frequencies equal to and higher than the cutoff frequency of the input audio signal and outputs the obtained signal to the LPF 13. The LPF 12 is realized by, for example, a secondary IIR filter.

The LPF 13 is also a low-pass filter and is realized by a secondary IIR filter. Since the secondary IIR filters are formed in two stages using the LPF 12 and the LPF 13, these filters can be made equivalent to a one-stage quadratic IIR filter and can realize steep characteristics.

Only the low-frequency range of the audio signal is extracted by the LPF 12 and the LPF 13 and output to the harmonic generation section 14 as a signal Sa. The cutoff frequency of the filter realized by the LPF 12 and LPF 13 is assumed to be 100 Hz, for example.

The harmonic generation section 14 generates the harmonics of the signal Sa output from the LPF 13 and outputs the obtained signal to the LPF 15 as a signal Sb.

Figure 3:
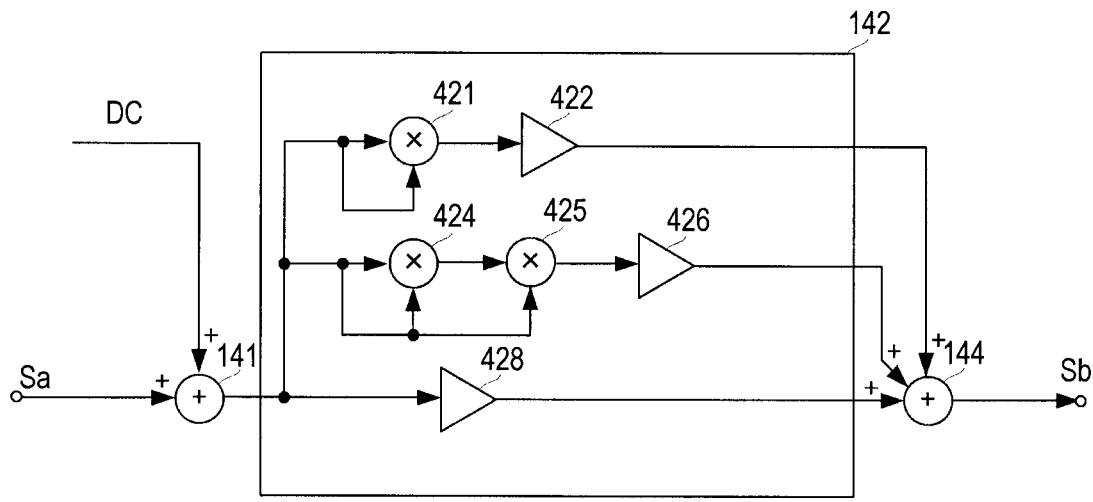
FIG. 3 is a block diagram showing a configuration of a harmonic generation section.

FIG. 3 is a block diagram showing a configuration of the harmonic generation section 14. As shown in FIG. 3, the harmonic generation section 14 is equipped with an adder 141, a calculation section 142 and an adder 144.

The input signal (the signal output from the LPF 13) Sa is input to the adder 141. The adder 141, corresponding to the bias processing section according to the present invention, adds a bias signal to the input signal Sa and outputs the obtained signal to the calculation section 142. The bias signal is a predetermined fixed value (DC in the figure) in this example. However, ideally, it is preferable that the present amplitude value (the absolute value of the amplitude) of the input signal Sa is added so that negative components are eliminated from the input signal Sa and so that no excessive bias signal is added.

Figure 4A:
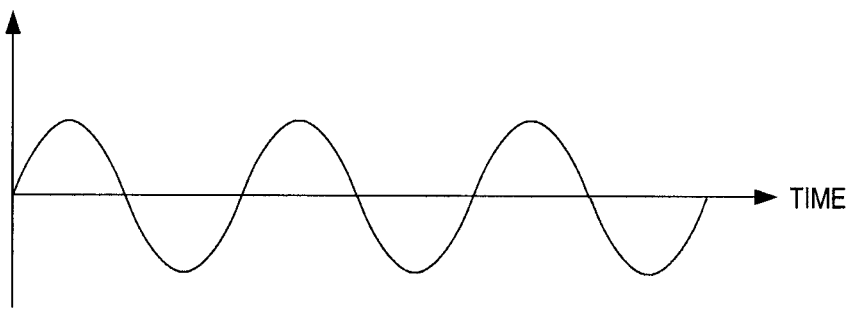
FIGS. 4A and 4B are graphs showing a case in which a bias signal is added.
Figure 4B:
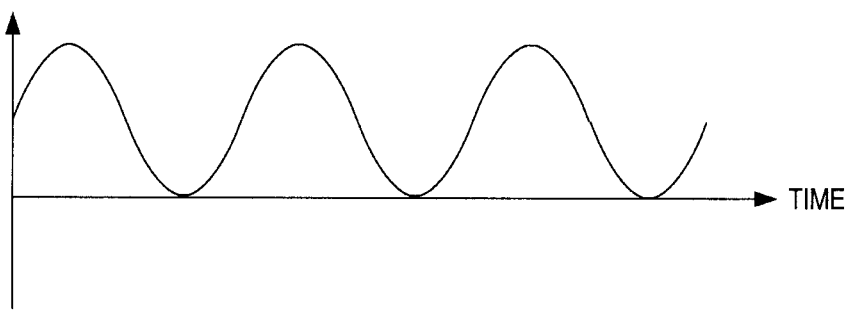

As a result, even if such a signal (a sine wave signal in this example) having negative components as shown in FIG. 4A is input, all the negative components are offset to the positive side as shown in FIG. 4B, whereby the signal is converted into a signal having no negative components. The signal to which the bias signal is added is input to the calculation section 142.

The calculation section 142 performs a power calculation on the input signal and generates harmonics. In other words, the input signal is squared by a multiplier 421, whereby even-numbered order harmonics are generated. The DC component generated by the second power calculation is eliminated by the LCF 16 described later. The level of the signal including the generated even-numbered order harmonics is adjusted by a level adjuster 422.

Similarly, the input signal Sa is cubed by a multiplier 424 and a multiplier 425, whereby odd-numbered order harmonics are generated. The level of the signal including the generated odd-numbered order harmonics is adjusted by a level adjuster 426.

Finally, the adder 144 adds the signal including the even-numbered order harmonics, the signal including the odd-numbered order harmonics and the signal (the signal input to the calculation section 142) subjected to level adjustment by a level adjuster 428, and then generates the output signal Sb.

Figure 5:
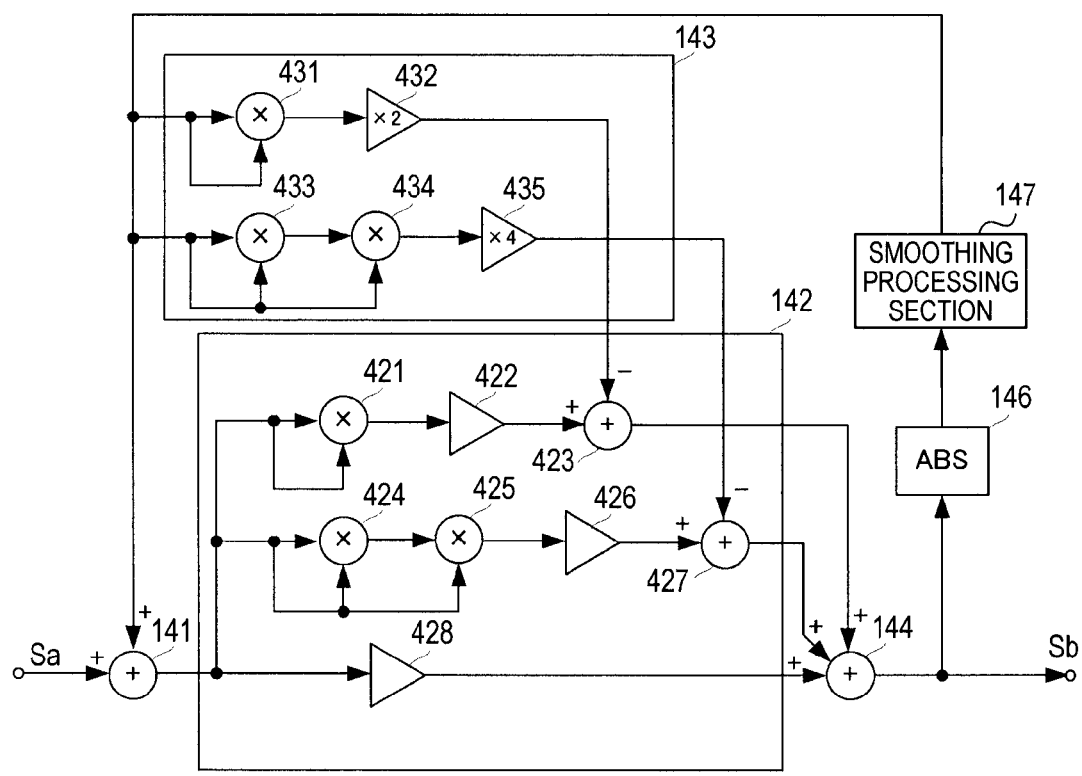
FIG. 5 is a block diagram showing another configuration of the harmonic generation section.

Although a configuration in which the fixed value (DC) is added as the bias signal has been described in this example, a variant example shown in FIG. 5 can also be used.

FIG. 5 is a block diagram showing another configuration of the harmonic generation section 14. Components common to those shown in FIG. 3 are designated by the same numerals and their descriptions are omitted. In this example, a bias amount calculation section 143, an ABS 146 for detecting the absolute value of the present amplitude of the output signal Sb, and a smoothing processing section 147 for smoothing the absolute value of the amplitude detected by the ABS 146 and outputting the absolute value as the bias signal are additionally provided for the harmonic generation section 14 shown in FIG. 3.

The adder 141 in this example is configured so as to add the value corresponding to the present amplitude value (the absolute value of the amplitude) so that negative components are eliminated from the input signal Sa and so that no excessive bias signal is added.

In addition, the input signal Sa actually includes not only a stable sine wave signal but also various signals. Hence, in this example, the amplitude value is smoothed on a time axis by the smoothing processing section 147, and a bias signal depending on the amplitude value smoothened on the time axis is calculated, whereby the bias signal is suppressed from changing abruptly and distorted sound is made inconspicuous even if the level of the input signal Sa rises or lowers abruptly.

Figure 6A:
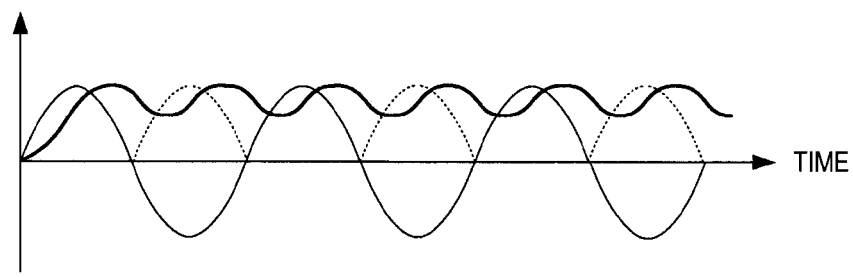
FIGS. 6A and 6B are graphs showing examples of smoothing processing.
Figure 6B:
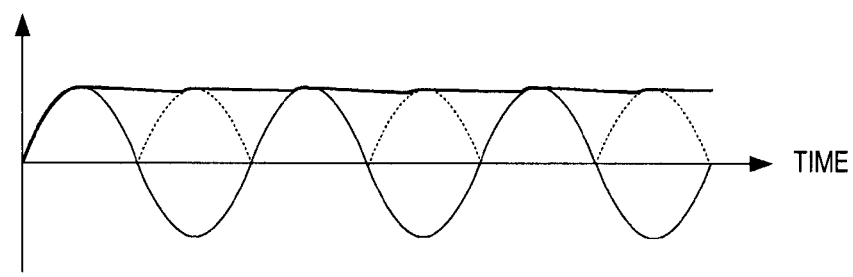

The smoothing processing section 147 is realized by subjecting the instantaneous amplitude value to moving average processing as indicated by the thick solid line shown in FIG. 6A. Furthermore, a method for suppressing abrupt changes may be used by performing peak hold processing in which a peak value is held while being attenuated with a predetermined time constant as indicated by the thick solid line shown in FIG. 6B. Alternatively, a configuration in which low-pass filtering processing is performed may also be used.

Although the above-mentioned processing is used to detect an amplitude value for each sample and to perform smoothing processing, it may also be possible to use processing in which the maximum amplitude value is detected in block units, each block consisting of a certain number of samples, and the maximum amplitude value in each block is used or the maximum amplitude value is smoothened. In this case, the operation amount of the processing can be reduced.

Furthermore, the calculation section 142 in this example is equipped with an adder 423 and an adder 427. The adder 423 eliminates an unwanted bias signal from the even-numbered order harmonics. The adder 427 eliminates an unwanted bias signal from the odd-numbered order harmonics.

The unwanted bias signal is calculated by the bias amount calculation section 143. The bias amount calculation section 143 squares the bias signal (corresponding to the absolute value of the present amplitude) input from the smoothing processing section 147 using a multiplier 431 and performs level adjustment using a level adjuster 432, thereby calculating the unwanted bias signal of the even-numbered order harmonics.

For example, when it is assumed that the absolute value of the present amplitude is A, the amplitude value A' of the even-numbered order harmonics generated by the calculation section 142 is represented by $A'=$(the amplitude value A of the original signal+the bias signal $A)^2=4\cdot A^2$. Since the unwanted bias signal is half the amplitude value of the even-numbered order harmonics, the component is $2\cdot A^2$. Hence, the gain of the level adjuster 432 is doubled.

Similarly, the bias amount calculation section 143 cubes the bias signal (corresponding to the absolute value of the present amplitude) input from the smoothing processing section 147 using a multiplier 433 and a multiplier 434 and performs level adjustment using a level adjuster 435, thereby calculating the unwanted bias signal of the odd-numbered order harmonics.

For example, when it is assumed that the absolute value of the present amplitude is A, the amplitude value A' of the odd-numbered order harmonics generated by the calculation section 142 is represented by $A'=$(the amplitude value A of the original signal+the bias signal $A)^3=8\cdot A^3$. Since the unwanted bias signal is half the amplitude value of the odd-numbered order harmonics, the component is $4\cdot A^3$. Hence, the gain of the level adjuster 435 is quadrupled.

Although an example in which a second power calculation and a third power calculation are performed as power calculations is given in this embodiment, higher harmonics may be generated by performing a fourth power calculation, a fifth power calculation, etc.

The output signal Sb generated as described above is input to the DRC 18 via the LPF 15, the LCF 16 and the Delay 17.

The LPF 15, serving as a low-pass filter for eliminating the high order components generated at the time when the harmonics were generated, attenuates the band components having frequencies not less than a cutoff frequency (for example, 300 Hz) from the signal output from the harmonic generation section 14, and then outputs the obtained signal to the LCF 16. The LPF 15 is also realized by a secondary IIR filter.

The LCF 16, serving as a high-pass filter for eliminating the DC component and the unwanted bias signal (corresponding to the above-mentioned fixed value DC) generated at the time when the harmonics were generated, attenuates the band components having frequencies not more than a predetermined frequency (for example, 70 Hz) from the signal output from the LPF 15. The LCF 16 is also realized by a secondary IIR filter, for example.

Figure 7:
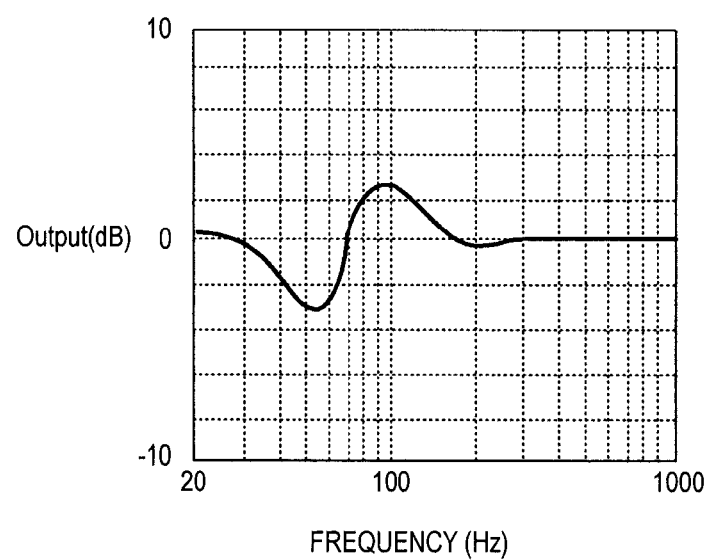
FIG. 7 is a graph showing a change in frequency characteristics.

FIG. 7 is a graph showing an example of the frequency characteristics of the signal output from the LCF 16. When it is assumed that the frequency characteristics of the original signal are flat (0 dB in the entire band), the frequency characteristics of the signal output from the LCF 16 have a shape in which the energy of the low-frequency part (for example, 70 Hz or less) of the original signal is changed to the energy of the harmonic part (for example, 70 to 300 Hz). The listener listening to the sound of this harmonic part (70 to 300 Hz) senses the sound as the sound of the low-frequency part (70 Hz or less) by virtue of the missing fundamental phenomenon.

The frequency characteristics of the signal output from the LCF 16 can be changed by adjusting the cutoff frequencies of the LPF 12 and the LPF 13, the gain ratios of the level adjuster 422, the level adjuster 426 and the level adjuster 428, and the cutoff frequencies of the LPF 15 and the LCF 16.

The signal described above is output from the LCF 16 to the Delay 17. The Delay 17 is provided for sound quality adjustment and not essential in the present invention. The signal delayed by the Delay 17 is input to the DRC 18.

Figure 8A:
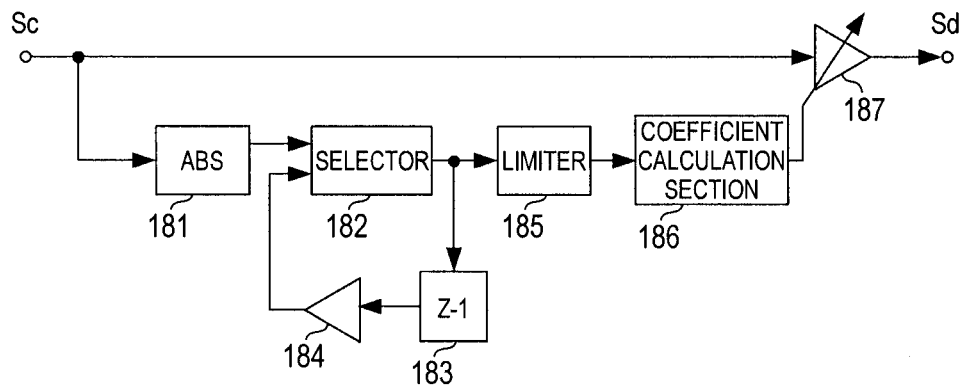
FIGS. 8A and 8B are block diagrams showing the configuration of a dynamic range compression section.

The DRC 18 is equipped with an absolute value operation section (ABS) 181, a selector 182, a delay device 183, a gain adjustment section 184, a limiter 185, a coefficient calculation section 186 and a level adjuster 187 as shown in FIG. 8A.

The DRC 18 compresses the dynamic range of the signal Sc output from the Delay 17, thereby appropriately controlling the level of the harmonic components.

The ABS 181 outputs the absolute value of the amplitude of the signal Sc input thereto.

The selector 182 compares the amplitude value output from the ABS 181 with the amplitude value of the preceding sample and then outputs the larger value, thereby realizing peak hold processing.

In other words, the value output from the selector 182 is delayed by one sample by the delay device 183, attenuated with a predetermined time constant (for example, a time constant of approximately −6 dB/150 ms) by the gain adjustment section 184 and then input to the selector 182. Hence, the output waveform of the selector 182 instantaneously responds to the large peak of the signal Sc of low-band components, the signal Sc having been converted into the absolute value, and then a waveform in which the peak is held at an attenuation characteristic of −6 dB/150 ms is obtained. As a result, since the signal Sc is smoothed on the time axis, even if the signal Sc changes abruptly, the state of the compression of the dynamic range of the signal does not change abruptly.

Even in this example, it may be possible that the maximum amplitude value is detected in block units, each block consisting of a certain number of samples, and smoothing processing is performed.

Next, the limiter 185 is an operation section that is used to limit the value output from the selector 182 so that the value does not exceed a predetermined range. For example, in order that the output value is within the range of 0 dB to −40 dB, the limiter 185 outputs a value of −40 dB in the case that the input value is less than −40 dB and outputs a value of 0 dB in the case that the input value is more than 0 dB. The value limited within the predetermined range by the limiter 185 is input to the coefficient calculation section 186.

Figure 8B:
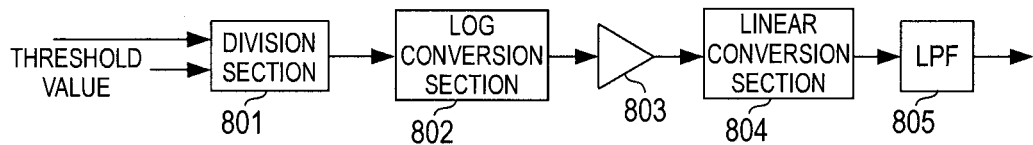
Figure 9:
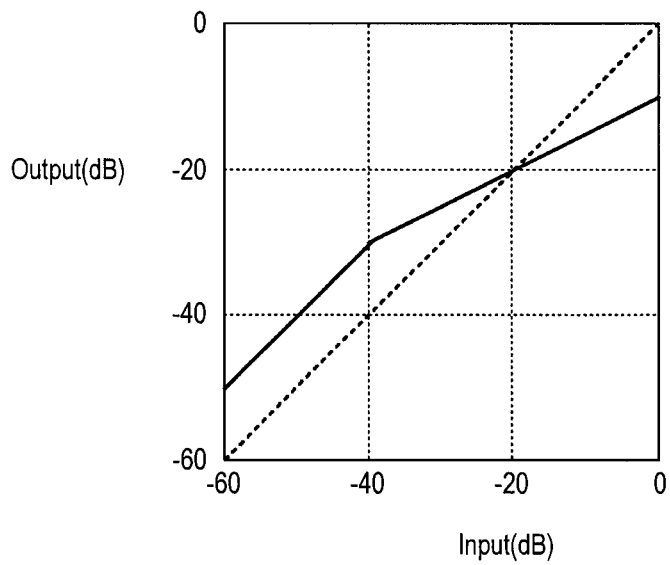
FIG. 9 is a graph showing an example of the compression of a dynamic range.
Figure 10A:
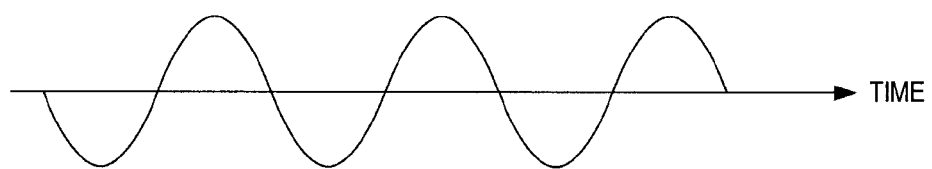
FIGS. 10A and 10B are graphs showing an example in which negative components are converted into positive components by a second power calculation.
Figure 10B:
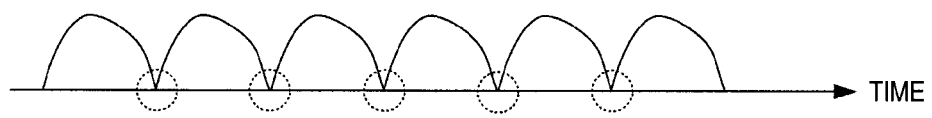

The coefficient calculation section 186 multiplies the input value by a predetermined coefficient to obtain the multiplication coefficient of the level adjuster 187. FIG. 8B is a block diagram showing the configuration of the coefficient calculation section 186. FIG. 9 is a graph showing an example of the compression of the dynamic range. The horizontal axis of FIG. 9 represents the input value and the vertical axis thereof represents the output value. The broken line in the graph indicates an input/output relation in the case that DRC operation is not performed (linear output). The solid line in the graph indicates an input/output relation in the case that DRC operation is performed.

As shown in FIG. 8B, the coefficient calculation section 186 is equipped with a division section 801, a Log conversion section 802, a ratio adjuster 803, a Linear conversion section 804 and an LPF 805.

The division section 801 outputs a linear value obtained by dividing the input value by a predetermined threshold value. For example, as shown in FIG. 9, in the case that the dynamic range is compressed while −20 dB is at the center of the range, the threshold value is set to −20 dB. In this case, the division section 801 outputs 1 when a value of −20 dB is input. A value less than −20 dB is converted into a value larger than 1, and a value larger than −20 dB is converted into a value less than 1.

The Log conversion section 802 converts the linear value output from the division section 801 into a logarithmic value and outputs the value. The ratio adjuster 803 multiplies the input logarithmic value by a predetermined compression coefficient (for example, 0.5). Then, the Linear conversion section 804 converts the logarithmic value calculated by the ratio adjuster 803 into a linear value. The LPF 805 is used to suppress the steep change of the coefficient.

The coefficient calculated as described above is used as the multiplication coefficient of the level adjuster 187. The dynamic range of the signal Sc input to the DRC 18 is compressed, and the obtained signal is output as a signal Sd.

For example, as shown in FIG. 9, the dynamic range of a signal in the range of −40 to 0 dB (a dynamic range of 40 dB) is compressed to the dynamic range corresponding to the above mentioned compression coefficient (0.5) while −20 dB is at the center of the range, and a signal in the range of −30 to −10 dB (a dynamic range of 20 dB) is output. The multiplication coefficient for a signal in the range of less than −40 dB is made equal to that for a signal of −40 dB by the above-mentioned limiter 185, whereby the change in the gain of the output signal with respect to the input signal becomes constant (+10 dB).

By the compression of the dynamic range described above, the high-level (−20 dB or more) harmonic components are suppressed and the low-level harmonic components are raised, whereby the harmonic components can be further emphasized. However, the compression of the dynamic range is not essential in the present invention.

The signal Sd output from the DRC 18 is input to the addition section 19. Since the signal Sd is generated at each channel, the addition section 19 adds the signal Sd of each channel input from the DRC 18 to the signal (Cin, Lin, Rin, SLin, SRin, SBLin, SBRin, LFEin) input from the input section 1.

The low-frequency band expansion processing section 11 may be configured so that the audio signals of a plurality of channels are added and then harmonic components are generated. In this case, the low-frequency band expansion processing section 11 may perform processing in which the audio signal obtained after the addition is divided by the number of the channels concerning the addition of the audio signals and normalized. Furthermore, the levels of the audio signals to be added at all the channels may be the same, or the levels of the audio signals at some of the channels may be raised and added so that the audio signals at the channels are emphasized.

Furthermore, in the case that the audio signals of a plurality of channels are added and then the signal Sd is generated, if the same signal Sd is input to each channel, only the harmonic components become excessively large. Hence, it is assumed that the signal Sd is divided beforehand by the number of the channels concerning the addition of the audio signals in the low-frequency band expansion processing section 11.

The levels of the audio signals to be added at all the channels may be the same, or the levels of the signals Sd (the signals after the division) at some of the channels may be raised and then added so that the audio signals at the channels are emphasized. Moreover, without being limited to the example in which the addition is performed for the audio signals of all the channels, but an example in which the addition is performed for the audio signals of some of the channels may be used.

Still further, in this example, after the signals Sd are added, the frequency characteristics of the audio signals of the respective channels are adjusted individually at the PEQs 21 (PEQ 21L, PEQ 21R, PEQ 21SL, PEQ 21SR, PEQ 21SBL, PEQ 21SBR, PEQ 21LFE and PEQ 21C). The PEQs 21 are not essential in the present invention, but are used to raise the levels of predetermined frequency bands so as to emphasize the harmonic components. In particular, in the case that non-integer multiple harmonic components are input to the input signal Sin, the non-integer multiple harmonic components may remain in the pass-bands of the LPF 15 and the LCF 16 and may be included as unwanted distorted sound. In this case, the level of the signal Sd is required to be lowered so that the distorted sound does not become conspicuous. Therefore, the levels of predetermined frequency components are raised (or the other frequency bands are lowered) by the PEQs 21, whereby the frequency characteristics are adjusted so that the harmonic components are emphasized.

According to an aspect of the invention, an audio signal processing device includes: an input section to which an audio signal is input; a bias processing section configured to add a bias signal to the audio signal; a calculation section configured to perform a power calculation on the audio signal to which the bias signal has been added by the bias processing section; and an adding unit configured to add the audio signal on which the power calculation is performed by the calculation section to the audio signal having been input to the input section. The calculation section performs power calculations (for example, second and third power calculations) on an audio signal and generates harmonics. At this time, the bias processing section adds a bias signal to the audio signal to decrease the negative components of the audio signal so that the negative components are not converted into positive components by a power calculation (for example, a second power calculation) that is performed to generate even-numbered order harmonics.

Although the bias signal may be a fixed value, it is desired that the bias signal corresponding to the amplitude value of the original audio signal is applied so that, ideally, no negative component is present and no excessive bias signal is added.

However, since the amplitude value of the audio signal changes every moment, it is desirable that a value obtained by performing smoothing processing to suppress a steep change is used as the bias signal. The smoothing processing may be processing for smoothing instantaneous amplitude values or may be peak hold processing for smoothing peak values.

With the present invention, harmonics can be generated while suppressing the change in the waveform of an original signal.

What is claimed is:

1. An audio signal processing device comprising:
    an input section to which an audio signal is input;
    a bias processing section configured to add a bias signal to the audio signal;
    a bias amount calculation section configured to calculate an unwanted bias signal;
    a calculation section configured to perform a power calculation on, and to eliminate the unwanted bias signal from, the audio signal to which the bias signal has been added by the bias processing section; and
    an adding unit configured to add the audio signal on which the power calculation is performed by the calculation section and from which the unwanted bias signal is eliminated by the calculation section, to the audio signal having been input to the input section.

2. The audio signal processing device according to claim 1, wherein
    the audio signal includes audio signals of a plurality of channels, and
    the audio signals of the plurality of channels are processed individually.

3. The audio signal processing device according to claim 1, further comprising: a DRC section configured to compress a dynamic range of the audio signal on which the power calculation is performed by the calculation section.

4. The audio signal processing device according to claim 1, wherein
    the bias processing section adds the bias signal corresponding to an amplitude value of the audio signal.

5. The audio signal processing device according to claim 4, further comprising: a smoothing processing section configured to perform smoothing processing on the amplitude value of the audio signal, wherein
    the bias processing section adds the bias signal corresponding to the amplitude value on which the smoothing processing is performed by the smoothing processing section.

6. The audio signal processing device according to claim 5, wherein the smoothing processing includes peak hold processing.

7. An audio signal processing method comprising:
    inputting an audio signal;
    adding a bias signal to the audio signal;
    calculating an unwanted bias signal;
    performing a power calculation on, and eliminating the unwanted bias signal from, the audio signal to which the bias signal has been added; and
    adding the audio signal on which the power calculation is performed and from which the unwanted bias signal is eliminated, to the audio signal having been input.

* * * * *